United States Patent [19]

Brannigan et al.

[11] Patent Number: 4,639,896
[45] Date of Patent: Jan. 27, 1987

[54] REDUNDANT ROW DECODING FOR PROGRAMMABLE DEVICES

[75] Inventors: Michael J. Brannigan, Palm Bay, Fla.; David L. Rutledge, Beaverton, Oreg.

[73] Assignee: Harris Corporation, Melbourne, Fla.

[21] Appl. No.: 676,846

[22] Filed: Nov. 30, 1984

[51] Int. Cl.$^4$ .............................................. G11C 7/00
[52] U.S. Cl. ................................... 365/200; 365/189
[58] Field of Search ................. 365/189, 200, 210, 96, 365/230; 371/10; 307/200 A; 330/207 P

[56] References Cited

U.S. PATENT DOCUMENTS 4,250,570  2/1981  Tsang et al. ......................... 365/200
4,290,119  9/1981  Masuda et al. ...................... 365/189

OTHER PUBLICATIONS

"New PROM Technology Provides High System Throughput"; W. Plummer; Intel Corporation; 33/3, pp. 1-5.

Primary Examiner—Joseph A. Popek
Attorney, Agent, or Firm—Barnes & Thornburg

[57] ABSTRACT

A redundant row scheme having a protection circuit between the programmable decoder and the line driver of a redundant row system which provides a path to ground for discharging the row line and limits the voltage across the programmable decoder to prevent growback of the programmed fuses.

7 Claims, 1 Drawing Figure

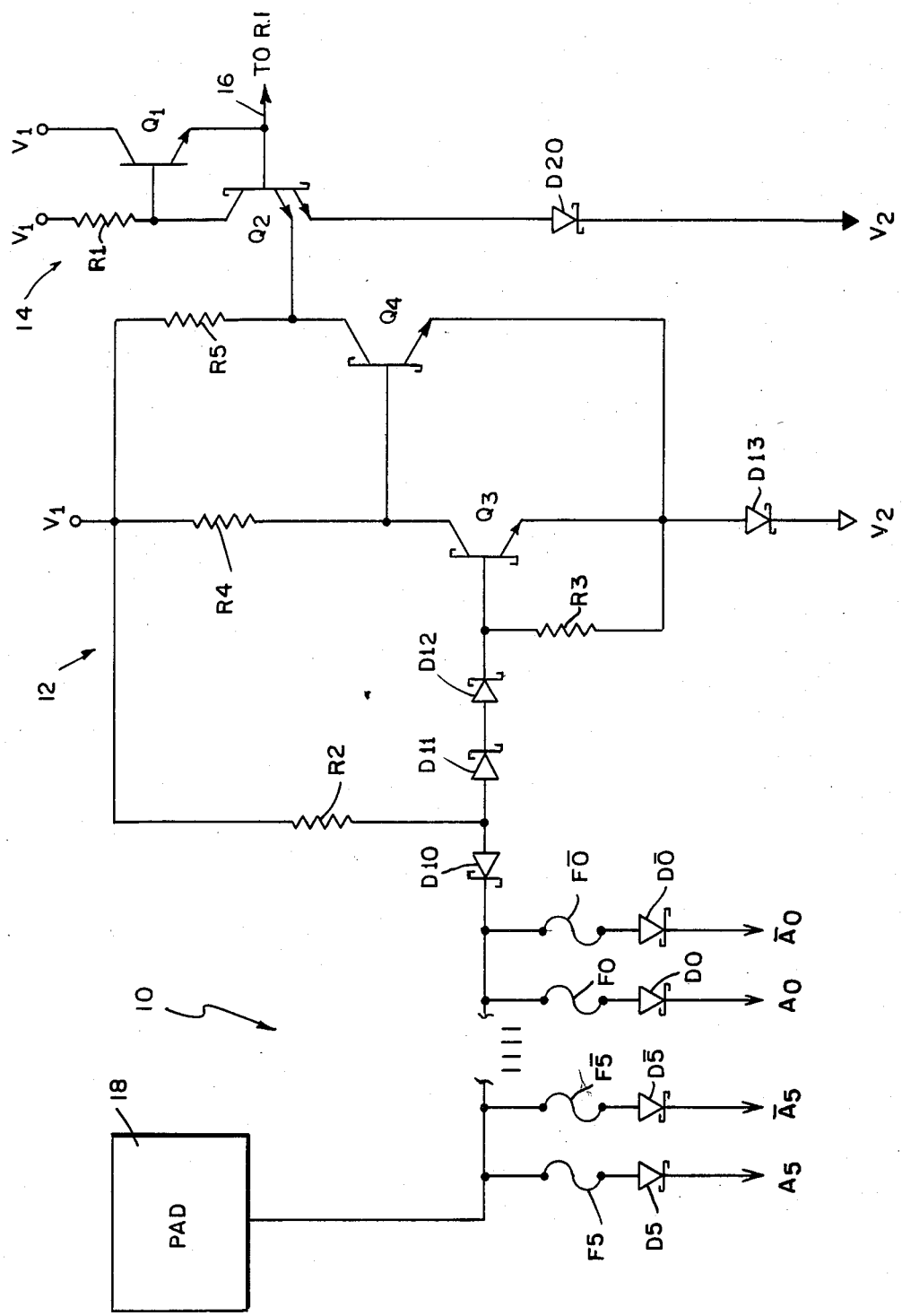

REDUNDANT ROW DECODING FOR PROGRAMMABLE DEVICES

BACKGROUND AND SUMMARY OF THE INVENTION

The present invention relates generally to memory or logic arrays and more specifically to an improved redundancy for memory or logic arrays.

In order to increase yield in memory and logic arrays, it has been suggested that redundant rows be provided. These rows include their own separate decoder having programmable elements in the decoder such that the row may be programmed to decode a defective row identified by testing. The decoder is connected to the row by a row driver. The programmable elements of the decoder are generally fuses which are blown to appropriately address the decoder using a pad which provides voltage across the fuses with the appropriate addresses provided to the input of the decoder. In prior art redundant row schemes, the redundant row and row driver are not properly isolated from the programmable decoder. The row is connected to the decoder and discharged to ground through the decoder. This produces undesirable currents through the programmable decoder. Also, for certain kinds of fuses, specifically metal fuses, grow-back of the blown fuses has occurred through metal migration because of the voltage applied across the programmed fuse when that line was addressed in combination with the voltage available from the line driver.

Thus, it is an object of the present invention to provide a redundant row scheme which protects the programmable decoder from the row drivers and the row line.

Another object of the present invention is to provide a scheme for redundant rows which prevents grow-back of programmed metal fuses in a programmable decoder.

Still another object of the present invention is to protect the row decoder from the row capacitance in a redundant row system.

These and other objects of the invention are attained by providing a protection circuit between the programmable decoder and the line driver of a redundant row system which provides a path to ground for discharging the row line and limits the voltage across the programmable decoder to prevent grow-back of the programmed fuses.

Other objects, advantages and novel features of the present invention will become apparent from the following detailed description of the invention when considered in conjunction with the accompanying drawings.

BRIEF DESCRIPTION OF THE DRAWINGS

The FIGURE is a schematic of a redundant row decoding incorporating the principles of the present invention.

DETAILED DESCRIPTION OF THE DRAWINGS

As is well known in the prior art, a memory or logic array has a plurality of rows and columns. A decoder uniquely selects the rows and provides a signal to a row driver to activate the row. In some systems a redundant row, row driver and programmable row decoder are provided which is capable of being programmed to replace a defective row. As illustrated in the FIGURE, a programmable row decoder 10 is connected through a protection circuit 12 to a line driver 14 connected to the redundant row 16. A pad 18 is connected to the programmable decoder 10. The programmable decoder 10 includes a plurality of fuses $F_0$, $F_{\bar{0}}$ ... $F_{\bar{5}}$, $F_5$ connected in series with a plurality of Schottky diodes $D_{\bar{0}}$, $D_0$ ... $D_{\bar{5}}$, $D_5$ which are connected to the appropriate input signals $A_{\bar{0}}$, $A_0$ ... $A_5$, $A_{e,ovs/5/}$. To program the programmable decoder 10, the address is provided on the inputs A and a programming voltage is applied to pad 18. This will blow the fuses of the inverse addressed elements and leave the addressed elements intact. For other kinds of logic inputs, the address itself may be applied to perform inverse logic functions.

The line driver 14, which is similiar to all line drivers for the regular lines, includes a first transistor Q1 having its collector connected to a voltage source $V_1$, its emitter connected to the redundant line 16 and its base connected to the juncture of resistor $R_1$ and the collector of Schottky transistor Q2. The other end of resistor $R_1$ is connected to the voltage source $V_1$. The transistor Q2 has its base connected to the redundant line 16 and the emitter of transistor Q1. A transistor Q2 includes a first emitter connected to a voltage source $V_2$ by a Schottky diode $D_{20}$ which acts as a row clamp and its second emitter connected to the protection circuit 12.

The protection circuit 12 includes a first resistor $R_2$ connected between a first voltage source $V_1$ and the anodes of back-to-back Schottky diodes $D_{10}$ and $D_{11}$. The cathode of Schottky diode $D_{10}$ is connected to the common line with the programmable decoder 10. A third Schottky diode $D_{12}$ is connected between Schottky diode $D_{11}$ and the base of transistor Q3. A resistor $R_3$ connects the base of transistor Q3 to its emitter which is connected to a ground or voltage source $V_2$ through Schottky diode $D_{13}$. The collector of transistor Q3 is connected to the voltage source $V_1$ through resistor $R_4$. A second transistor Q4 of the protection circuit 12 includes its base connected to the collector of transistor Q3, its emitter connected to the diode $D_{13}$ and its collector connected to the voltage source $V_1$ by the resistor $R_5$. The collector of Q4 is also connected to the second emitter of the transistor Q2 of the line driver 14.

As will be explained more fully below, the transistor Q4 is a switch which offers a path to ground from the redundant row 16 and the redundant row driver 14 to discharge the capacitance on the line 16 through diode $D_{13}$ without going through the programmable decoder 10 when the decoder is deselected. Also, the diode $D_{10}$ provides protection of the protection circuit 12 and the driver 14 during programming of the programmable decoder 10. The diodes $D_{11}$, $D_{12}$, the base-to-emitter diode of Q3 and the diode $D_{13}$ provide four diode drops to ground. With the diode drop of $D_{10}$ and any of the addressing diodes $D_0$ through $D_5$ the voltage across any of the fusible elements $F_0$ through $F_5$ is limited to two diode drops. This prevents regrowth of the fused elements from any voltage which may be present from the redundant line 16 or the line driver 14.

When the redundant row 16 is to be selected, the programmed decoder 10 performs an AND function wherein all of the non-programmed inputs must be high. This maintains diode $D_{10}$ reversed bias which allows the forward biasing of diodes $D_{11}$ and $D_{12}$. This turns on transistor Q3 turning off transistor Q4. With the transistor Q4 off, the emitter of transistor Q2 is high maintaining Q2 of the row driver 14 on through row clamp and consequently Q1 is on. This pulls up the redundant row RR to the voltage source $V_1$ minus the voltage drop across the transistor Q1, and the IR drop through $R_1$.

If any of the unprogrammed input signals are low, diode $D_{10}$ becomes forward biased which reverse biases diodes $D_{11}$ and $D_{12}$ turning off transistor Q3. With transistor Q3 off, transistor Q4 is turned on which provides a connection to ground through D13 for the emitter of transistor Q2 of the row driver 14. This turns on Q2 which turns off Q1 disconnecting the redundant row line 16 from the voltage source V1 and allows discharge of the redundant row 16 and any capacitance in the row driver 14 down through transistor Q4 and diode $D_{13}$ to ground. This preferential path as well as the reverse biased diodes $D_{11}$ and $D_{12}$ and off transistor Q3 prevents the discharge current from flowing to the programmable decoder 10.

As discussed earlier, the diodes $D_{11}$, $D_{12}$, transistor Q13 and diode $D_{13}$ provide a clamp for the input to the protection circuit 12 and prevents the voltage across any of the fusable elements during normal operation from rising above that voltage which will cause regrowth of the material. The pad 18 being on the other side of diode $D_{10}$ allows programming voltages provided to pad 18 to raise the voltage across the fusable elements sufficient to blow the appropriate fuses.

Thus, it can be seen that the protection circuit 12 of the present invention provides a discharge path for the line capacitance of the redundant row other than through the programmable decoder 10 as well as providing a clamp to prevent the voltage across the fuse from the redundant row driver and redundant row from rising above a voltage which would aid grow-back of the fusable elements. As mentioned previously, metal fuses for example, nichrome are very susceptible to grow-back.

From the preceding description of the preferred embodiments, it is evident that the objects of the invention are attained, and although the invention has been described and illustrated in detail, it is to be clearly understood that the same is by way of illustration and example only and is not to be taken by way of limitation. Although NPN transistors have been shown, PNP transistors may also be used. Similarly, any or all the Schottky diodes may be emitter-base diodes of a Schottky transistor. The spirit and scope of the invention are to be limited only by the terms of the appended claims.

What is claimed is:

1. In a memory array having at least one redundant row, programmable decoder for said redundant row, and a row driver connected between said programmable decoder and said redundant row, the improvement comprising:
    protection means connected between said programmable decoder and said row driver for isolating said decoder from said row driver and for limiting the voltage across said programmable decoder.

2. A memory according to claim 1 wherein said protection means includes first switch means for discharging said row to a common potential through said driver when said row is deselected.

3. A memory according to claim 2 wherein said protection means includes clamping means for limiting the voltage across said programmable decoder to prevent grow-back of a programmable fuse.

4. In a memory array having at least one redundant row, programmable decoder for said redundant row, and a row driver connected between said programmable decoder and said redundant row, the improvement comprising:
    first switch means connected between said programmable decoder and said row driver for discharging said row to a common potential through said driver when said row is deselected; and
    clamping means connected between said programmable decoder and said first switching means for limiting the voltage across said programmable decoder.

5. A memory according to claim 4 wherein said programmable decoder includes a plurality of metal fuses and said clamping means limits said voltage across said fuses to prevent grow-back of a programmed fuse.

6. A memory according to claim 4 wherein said first switch includes a transistor having its emitter-collector connected between said row driver and said common potential and a base, and an inverter connected between said programming decoder and said base for turning said transistor on and off.

7. A memory according to claim 4 wherein said clamping means includes a pair of diodes connected between said programmable decoder and the base of a transistor and the emitter of said transistor being connected to said common potential.

* * * * *